US012761564B2

(12) United States Patent
Han et al.

(10) Patent No.: US 12,761,564 B2
(45) Date of Patent: Oct. 13, 2026

(54) SYNCHROTRON LIGHT SOURCE

(71) Applicant: ESOL, Inc., Hwaseong-si (KR)

(72) Inventors: Jang Hui Han, Hwaseong-si (KR); SoJeong Lee, Suwon-si (KR); Dong Gun Lee, Hwaseong-si (KR)

(73) Assignee: E-SOL, Inc., Hwaseong-si (KR)

( * ) Notice: Subject to any disclaimer, the term of this patent is extended or adjusted under 35 U.S.C. 154(b) by 214 days.

(21) Appl. No.: 18/900,747

(22) Filed: Sep. 29, 2024

(65) Prior Publication Data

US 2026/0036909 A1 Feb. 5, 2026

(30) Foreign Application Priority Data

Jul. 31, 2024 (KR) ........................ 10-2024-0101725

(51) Int. Cl.
*H05H 7/04* (2006.01)
*G03F 7/00* (2006.01)
*H05H 7/08* (2006.01)
*H05H 7/22* (2006.01)

(52) U.S. Cl.
CPC ........... *G03F 7/70033* (2013.01); *H05H 7/04* (2013.01); *H05H 7/08* (2013.01); *H05H 7/22* (2013.01); *H05H 2007/041* (2013.01); *H05H 2007/048* (2013.01); *H05H 2007/084* (2013.01)

(58) Field of Classification Search
CPC ........ G03F 7/70033; H05H 7/04; H05H 7/08; H05H 7/22; H05H 2007/041; H05H 2007/048; H05H 2007/084; H05H 13/10; H05H 2007/046; H05G 2/0023
See application file for complete search history.

(56) References Cited

U.S. PATENT DOCUMENTS 8,718,231 B2 * 5/2014 Balakin ................ A61B 6/0421 378/68
8,841,866 B2 * 9/2014 Balakin .................... H05H 7/10 315/503
8,896,239 B2 * 11/2014 Balakin .................... H05H 7/08 250/424

(Continued)

FOREIGN PATENT DOCUMENTS

CN 106797101 A 5/2017
EP 3136828 A1 * 3/2017 ............... H05H 7/10

(Continued)

OTHER PUBLICATIONS

Ken Takayama et al., “Racetrack-shape fixed field induction accelerator for giant cluster ions”, Physical Review Speciall Topics—Accelerators and Beams, vol. 18, p. 050101, May 18, 2015.

(Continued)

*Primary Examiner* — Wilson Lee
(74) *Attorney, Agent, or Firm* — Revolution IP, PLLC

(57) ABSTRACT

The present disclosure relates to a synchrotron light source for producing synchrotron radiation through acceleration of an electron beam, including: an electron gun for producing the electron beam; a plurality of accelerators arranged parallel to one another to continuously accelerate the electron beam produced from the electron gun; a storage ring for storing the electron beam accelerated through the plurality of accelerators; and an undulator for producing the synchrotron radiation from the electron beam stored in the storage ring.

17 Claims, 7 Drawing Sheets

(56) References Cited

U.S. PATENT DOCUMENTS

| | | | | |
|---|---|---|---|---|
| 8,901,509 | B2 * | 12/2014 | Balakin | G21K 1/087 378/65 |
| 8,941,336 | B1 | 1/2015 | Liu et al. | |
| 8,957,396 | B2 * | 2/2015 | Balakin | G21K 1/087 250/492.1 |
| 9,095,040 | B2 * | 7/2015 | Balakin | H05H 7/10 |
| 9,579,525 | B2 * | 2/2017 | Balakin | A61N 5/1067 |
| 9,826,614 | B1 * | 11/2017 | Bakeman | H05G 2/007 |
| 11,328,830 | B2 * | 5/2022 | Sahai | H05H 15/00 |
| 2005/0213708 | A1 * | 9/2005 | Lawrence | H01S 3/083 378/119 |
| 2005/0226383 | A1 * | 10/2005 | Rifkin | G21K 1/02 378/119 |
| 2010/0072405 | A1 * | 3/2010 | Yu | H01J 25/02 250/493.1 |
| 2013/0270452 | A1 * | 10/2013 | Sasaki | H05H 7/04 250/396 R |
| 2014/0048707 | A1 * | 2/2014 | Liu | H01J 37/02 315/503 |
| 2014/0299782 | A1 * | 10/2014 | Seryi | H05H 9/00 315/505 |
| 2017/0273168 | A1 * | 9/2017 | Konoplev | H05H 13/10 |
| 2018/0241172 | A1 * | 8/2018 | Ruth | G03F 7/70025 |
| 2018/0249568 | A1 * | 8/2018 | Ekinci | H05H 13/04 |
| 2019/0066859 | A1 | 2/2019 | De Jager et al. | |
| 2020/0383200 | A1 * | 12/2020 | Marks | G02F 1/11 |
| 2022/0166180 | A1 * | 5/2022 | Loewen | H01S 3/0903 |

FOREIGN PATENT DOCUMENTS

| | | | | |
|---|---|---|---|---|
| EP | 3716738 | A1 * | 9/2020 | H05H 7/04 |
| JP | 61-279048 | A | 12/1986 | |
| JP | 05-182799 | A | 7/1993 | |
| JP | 2001-006900 | A | 1/2001 | |
| JP | 2018-533043 | A | 11/2018 | |
| KR | 10-2038510 | B1 | 10/2019 | |
| KR | 2020-0110051 | A | 9/2020 | |
| RU | 2426282 | C1 | 8/2011 | |
| WO | WO-2016114989 | A1 * | 7/2016 | A61N 5/10 |
| WO | WO-2017036840 | A1 * | 3/2017 | H05G 2/00 |

OTHER PUBLICATIONS

Office Action of Korea Patent Application No. 10-2024-0101725 dated Oct. 14, 2025.

Extended Search Report of European Patent Application No. 24208000.0 dated Apr. 22, 2025.

"Research Disclosure", Research Disclosure, Kenneth Mason Publications, Hampshire, UK, GB, vol. 623, No. 42, Mar. 1, 2016 (Mar. 1, 2016), p. 203, XP007144668, ISSN: 0374-4353 [retrieved on Feb. 16, 2016].

* cited by examiner

SYNCHROTRON LIGHT SOURCE

CROSS REFERENCE TO RELATED APPLICATION OF THE DISCLOSURE

The present application claims the benefit of Korean Patent Application No. 10-2024-0101725 filed in the Korean Intellectual Property Office on Jul. 31, 2024, the entire contents of which are incorporated herein by reference.

BACKGROUND OF THE DISCLOSURE

Field of the Disclosure

The present disclosure relates to a synchrotron light source, more specifically to a synchrotron light source that is capable of being provided with a plurality of linear accelerators so that high power and reduction in amount of power consumed are achieved to provide excellent performance.

Background of the Related Art

Extreme ultraviolet lithography (EUVL) is considered as next-generation lithography that is most implementable and efficient in cost for a sub-22 nm half-pitch (HP) node (sub 7-nm technology node) for fabricating semiconductor devices in large mass. The EUVL is based on reflective optical components for a projection optical system and a mask.

A big change from 193 nm (ArF) photolithography to 13.5 nm EUV lithography in recent technologies is triggered by the availability of optical components in the range of EUV wavelengths. When a refractive optical system operates a photon beam, the wavelength of 193 nm is used, but only a reflective optical system is usable in the range of EUV wavelengths. Mo—Si coatings with reflectivity of 70% and bandwidth (BW) of 2% at 13.5 nm wavelength are adopted for mirrors and masks. Such multilayers add other complexity to a process. Strict requirements exist for the smoothness of the optical system and the mask.

An EUV mask consists of a substrate, a multilayer coating on the substrate, and absorption structures (e.g., tantalum nitride (TaN)) patterned on the multilayer coating. All of the layers of the EUV mask may have some defects that have to be detected and characterized before used in a scanner, so that the detected defects are repaired or the mask having the defects is discarded.

Therefore, EUV mask inspection tools are important elements, and further, in this case, it is important to detect phase errors generated due to the distortions occurring in the deep inside of the multilayer mirror. The mask inspection is carried out through pellicles on multilayer blanks, patterned masks, and final masks.

Other measuring methods using an ultraviolet (UV) microscope, atomic force microscope (AFM), scanning electron microscope (SEM), and the like are used for the mask inspection, but it is found that actinic mask inspection is a method needed necessarily in measuring EUV light. Only EUV light is deeply transmitted to a resonant multilayer structure.

The SEMATECH actinic inspection tool (Sharp High-NA Actinic Reticle review Project (SHARP)) as one of recent technologies is a high-resolution EUV Fresnel zone plate microscope dedicated to photomask research.

Therefore, there is a need to develop an EUV light source having high brightness and stability in EUV measurements in the field related.

PRIOR ART LITERATURE

Patent Literature (Patent literature) Korean Patent No. 10-2038510

(Patent literature) U.S. Pat. No. 8,941,336

SUMMARY OF THE DISCLOSURE

Accordingly, the present disclosure has been made in view of the above-mentioned problems occurring in the related art, and it is an object of the present disclosure to provide a synchrotron light source that is capable of designing a combination of a plurality of linear accelerators for accelerating an electron beam and a plurality of magnets for controlling the direction of the electron beam, thereby producing high-power synchrotron radiation and minimizing an amount of power consumed.

It is another object of the present disclosure to provide a synchrotron light source that is capable of minimizing an installation space thereof, thereby being installed and operated in a relatively small space.

It is yet another object of the present disclosure to provide a synchrotron light source that is capable of producing EUV light used in a semiconductor manufacturing process.

It is still another object of the present disclosure to provide a synchrotron light source that is capable of being more improved than an existing EUV light source device or replacing the existing EUV light source device.

To accomplish the above-mentioned objects, according to the present disclosure, there is provided a synchrotron light source for producing synchrotron radiation through acceleration of an electron beam, including: an electron gun for producing the electron beam; a plurality of accelerators arranged parallel to one another to continuously accelerate the electron beam produced from the electron gun; a storage ring for storing the electron beam accelerated through the plurality of accelerators; and an undulator for producing the synchrotron radiation from the electron beam stored in the storage ring.

According to the present disclosure, desirably, the plurality of accelerators may be adapted to accelerate the electron beam in such a way as to allow the electron beam produced from the electron gun to pass therethrough only once.

According to the present disclosure, desirably, the plurality of accelerators may include a plurality of linear accelerators arranged parallel to one another in a longitudinal direction on the plane.

According to the present disclosure, desirably, the plurality of accelerators may include a plurality of magnets for converting the direction of the electron beam from one of the plurality of linear accelerators to the next linear accelerator to transfer the electron beam converted in direction.

According to the present disclosure, desirably, the plurality of linear accelerators and the plurality of magnets may be connected to one another in the form of a one-way to allow the electron beam produced from the electron gun to be stored in the storage ring.

According to the present disclosure, desirably, the plurality of linear accelerators may include: a first linear accelerator for initially receiving the electron beam produced from the electron gun to accelerate the electron beam; a second linear accelerator arranged to face the first linear accelerator and receive the electron beam from the first linear accelerator; a third linear accelerator arranged parallel to the first linear accelerator at the outside of the first linear accelerator and receiving the electron beam from the second linear accelerator; a fourth linear accelerator arranged parallel to the second linear accelerator at the outside of the second linear accelerator and receiving the electron beam from the third linear accelerator; a fifth linear accelerator arranged parallel to the third linear accelerator at the outside of the third linear accelerator and receiving the electron beam from the fourth linear accelerator; and a sixth linear accelerator arranged parallel to the fourth linear accelerator at the outside of the fourth linear accelerator and receiving the electron beam from the fifth linear accelerator.

According to the present disclosure, desirably, the plurality of magnets may include: a first magnet for transferring the electron beam from the electron gun to the first linear accelerator; second to sixth magnets for transferring the electron beam emitted from one of the plurality of the linear accelerators to the next linear accelerator; and a seventh magnet for transferring the electron beam emitted from the sixth linear accelerator to the storage ring.

According to the present disclosure, desirably, the plurality of magnets may include: the first magnet for transferring the electron beam from the electron gun to one side of the first linear accelerator; the second magnet for transferring the electron beam emitted from the other side of the first linear accelerator to the other side of the second linear accelerator; the third magnet for transferring the electron beam emitted from one side of the second linear accelerator to one side of the third linear accelerator; the fourth magnet for transferring the electron beam emitted from the other side of the second linear accelerator to the other side of the fourth linear accelerator; the fifth magnet for transferring the electron beam emitted from one side of the fourth linear accelerator to one side of the fifth linear accelerator; the sixth magnet for transferring the electron beam emitted from the other side of the fifth linear accelerator to the other side of the sixth linear accelerator; and the seventh magnet for transferring the electron beam emitted from one side of the sixth linear accelerator to the storage ring.

According to the present disclosure, desirably, each magnet may consist of a combination of dipole magnets and quadrupole magnets to allow the electron beam passing through one of the plurality of linear accelerators to be transferred to the next linear accelerator.

According to the present disclosure, desirably, the dipole magnets and quadrupole magnets may be permanent magnets providing a magnetic field.

According to the present disclosure, desirably, the plurality of accelerators may be located inside the storage ring.

According to the present disclosure, desirably, each magnet may be formed of an achromatic bend combined with a quadrupole magnet, a quadrupole magnet, a dipole magnet, a quadrupole magnet, a dipole magnet, a quadrupole magnet, and a quadrupole magnet in order, to allow the electron beam passing through one of the plurality of linear accelerators to be transferred to the next linear accelerator.

According to the present disclosure, desirably, the plurality of linear accelerators may be laminatedly arranged parallel to one another on the plane.

According to the present disclosure, desirably, each dipole magnet and each quadrupole magnet may have a control coil for finely controlling the intensity of the magnetic field through the supply of an electric current.

According to the present disclosure, desirably, the control coil may be adapted to control the intensity of the magnetic field within the range of 5% of the intensity of the magnetic field.

According to the present disclosure, desirably, each dipole magnet and each quadrupole magnet may finely control the intensity of the magnetic field through the control of a driving motor.

According to the present disclosure, desirably, the undulator may produce extreme ultraviolet (EUV) light.

BRIEF DESCRIPTION OF THE DRAWINGS

The above and other objects, features and advantages of the present disclosure will be apparent from the following detailed description of the preferred embodiments of the disclosure in conjunction with the accompanying drawings, in which.

DETAILED DESCRIPTION OF THE PREFERRED EMBODIMENTS

Hereinafter, an explanation of a synchrotron light source according to the present disclosure will be given in detail with reference to the attached drawings.

According to the present disclosure, a synchrotron light source for producing synchrotron radiation through acceleration of an electron beam includes: an electron gun for producing the electron beam; a plurality of accelerators arranged parallel to one another to continuously accelerate the electron beam produced from the electron gun; a storage ring for storing the electron beam accelerated through the accelerator; and an undulator for producing the synchrotron radiation from the electron beam stored in the storage ring.

According to the important technological characteristics of the present disclosure, the synchrotron light source according to the present disclosure is configured to have a plurality of linear accelerators adapted to accelerate the electron beam and a plurality of permanent magnet-based magnets for connecting the plurality of linear accelerators, so that power consumption due to the use of electromagnets applied to the existing synchrotron light source can be removed and the magnets can be formed of only the permanent magnets.

Figure 1:
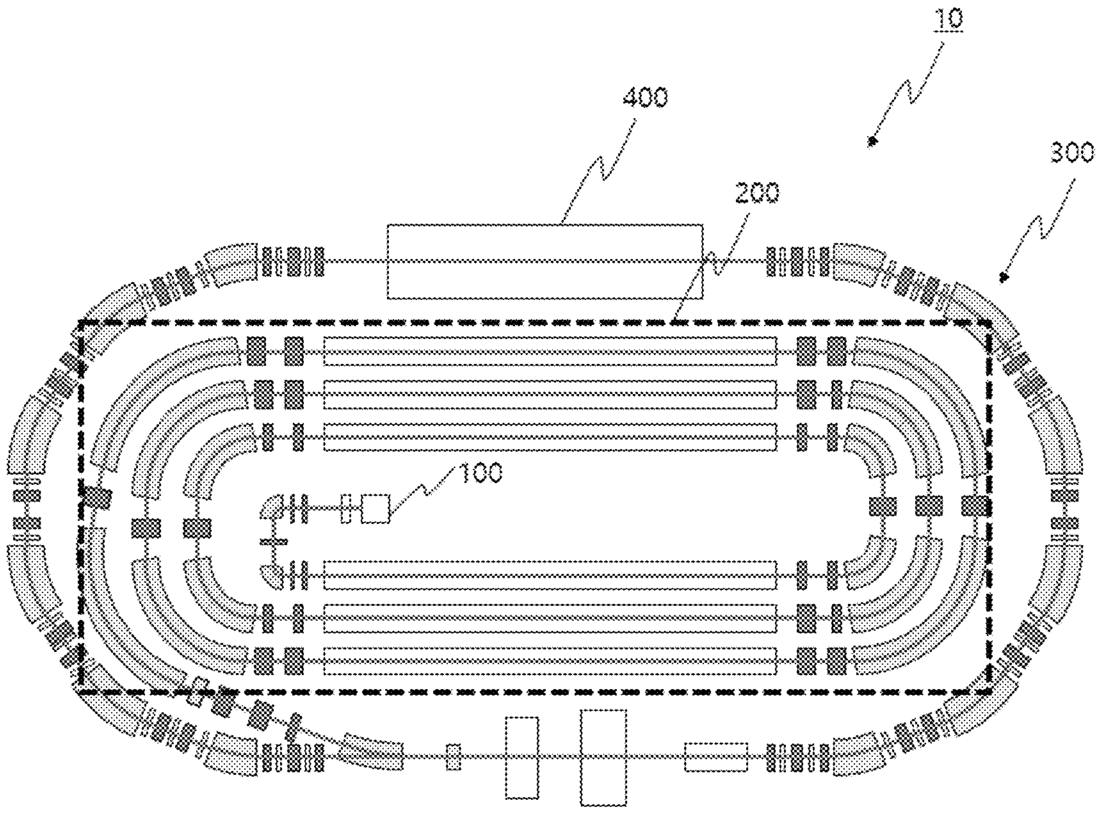
FIG. 1 is a schematic diagram showing a synchrotron light source according to the present disclosure.

FIG. 1 is a schematic diagram showing a synchrotron light source according to the present disclosure.

A synchrotron light source 10 according to the present disclosure includes an electron gun 100 for producing the electron beam, accelerators 200 for accelerating the electron beam produced from the electron gun 100 to produce the electron beam having desired energy, a storage ring 300 for storing the electron beam accelerated through the accelerators 200, and an undulator 400 for producing synchrotron radiation from the electron beam stored in the storage ring 300.

Desirably, the synchrotron light source 10 according to the present disclosure is a device for producing extreme ultraviolet (EUV) light, and in this case, the produced EUV light is desirably applied to a semiconductor manufacturing process.

Figure 2:
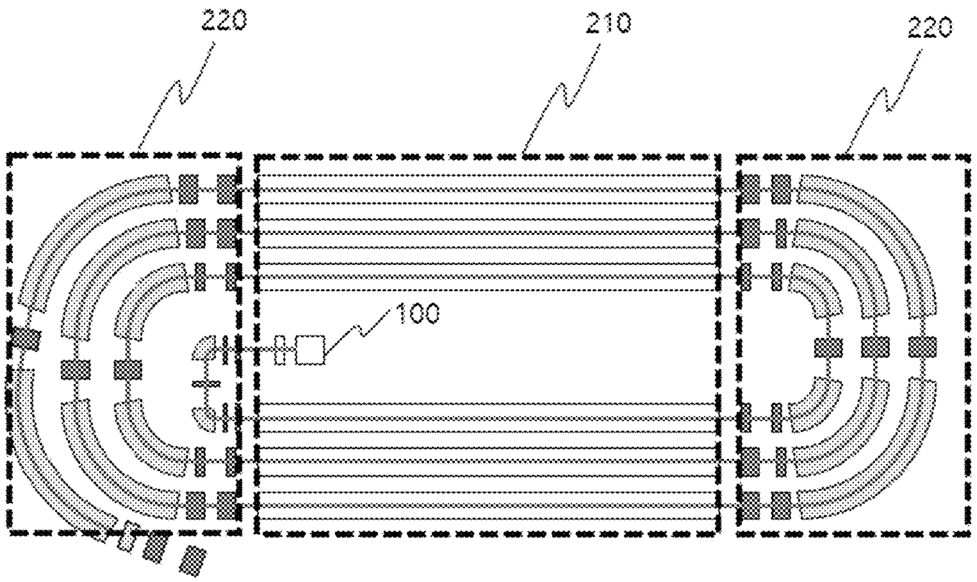
FIG. 2 is a detailed diagram showing accelerators of the synchrotron light source according to the present disclosure.

FIG. 2 is a detailed diagram showing the accelerators of the synchrotron light source according to the present disclosure.

According to the present disclosure, the accelerators 200 largely include a plurality of linear accelerators 210 and a plurality of magnets 220 for transferring the electron beam accelerated through the plurality of linear accelerators 210 to one another.

That is, the electron beam first produced from the electron gun 100 passes through one linear accelerator and is then transferred to next linear accelerator through one magnet 220. After that, the electron beam passing through the linear accelerator is transferred to next linear accelerator through another magnet 220.

According to the present disclosure, the plurality of linear accelerators 210 are arranged parallel to one another, and the electron beam is transferred through the plurality of magnets 220 located on both sides of the plurality of linear accelerators 210. Under such a configuration, the electron beam is efficiently accelerated in a limited space through the plurality of linear accelerators 210.

Figure 3:
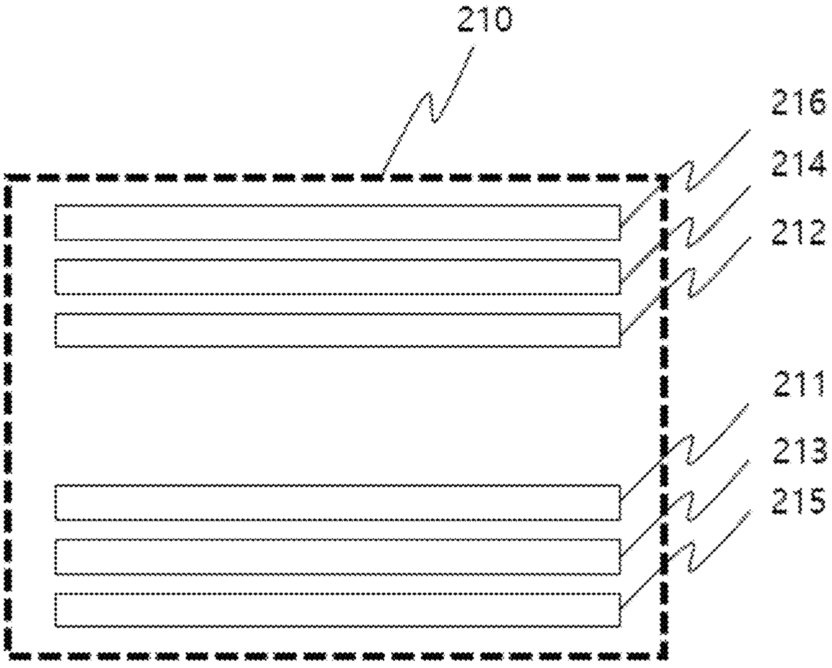
FIG. 3 is a detailed diagram showing linear accelerators of the synchrotron light source according to the present disclosure.

FIG. 3 is a detailed diagram showing the linear accelerators of the synchrotron light source according to the present disclosure.

Referring to FIG. 3, the linear accelerators arranged in parallel to one another as the main technological subject of the present disclosure will be explained in detail.

According to an embodiment of the present disclosure, three linear accelerators 210 are arranged parallel to one another at the lower side on the plane, and three linear accelerators 210 are arranged parallel to one another at the upper side on the plane.

In more detail, the linear accelerators 210 include a first linear accelerator 211 for initially receiving the electron beam produced from the electron gun 100 to accelerate the electron beam, a second linear accelerator 212 arranged to face the first linear accelerator 211 and receive the electron beam from the first linear accelerator 211, a third linear accelerator 213 arranged parallel to the first linear accelerator 211 at the outside of the first linear accelerator 211 and receiving the electron beam from the second linear accelerator 212, a fourth linear accelerator 214 arranged parallel to the second linear accelerator 212 at the outside of the second linear accelerator 212 and receiving the electron beam from the third linear accelerator 213, a fifth linear accelerator 215 arranged parallel to the third linear accelerator 213 at the outside of the third linear accelerator 213 and receiving the electron beam from the fourth linear accelerator 214, and a sixth linear accelerator 216 arranged parallel to the fourth linear accelerator 214 at the outside of the fourth linear accelerator 214 and receiving the electron beam from the fifth linear accelerator 215.

Like this, the electron beam accelerated through the coupling of the magnets 220 to both ends of the plurality of linear accelerators 210 arranged in parallel to one another is transferred, and therefore, the electron beam produced from the electron gun 100 passes through the accelerators 200 having the plurality of linear accelerators 210 and the plurality of magnets 220 only once and is thus accelerated and stored in the storage ring 300.

That is, the accelerators 200 are configured to allow the linear accelerators 210 and the magnets 220 to be connected to one another in the form of a one-way, so that the electron beam produced from the electron gun 100 is stored in the storage ring 300.

Figure 4:
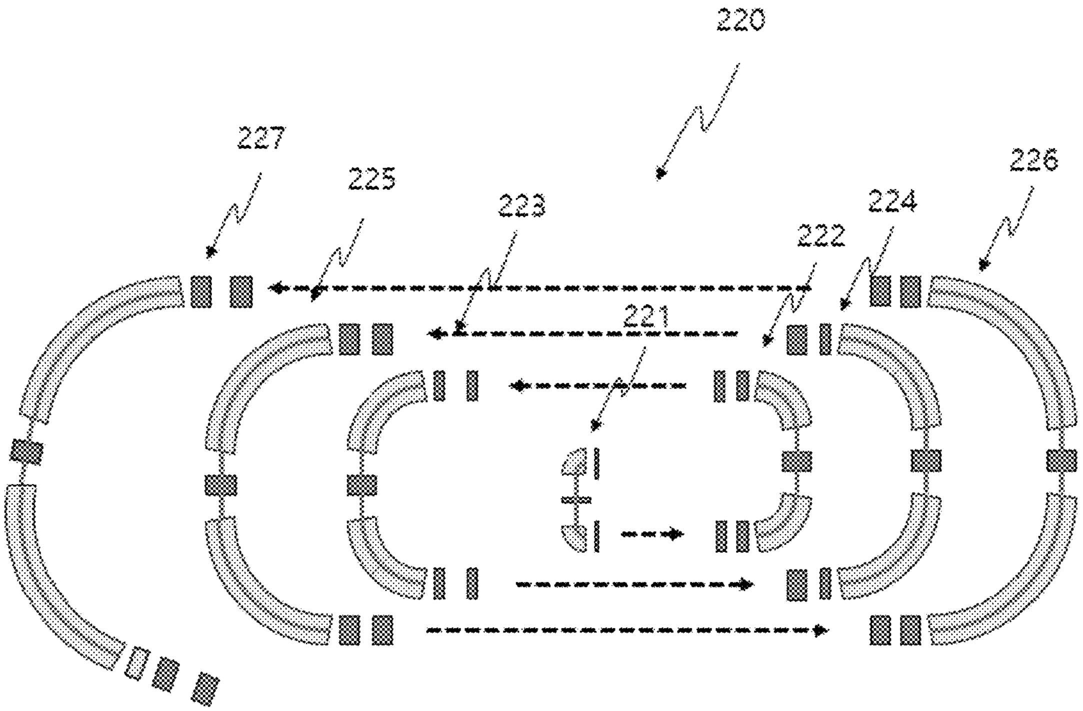
FIG. 4 is a diagram showing magnets of the synchrotron light source according to the present disclosure.

FIG. 4 is a diagram showing the magnets of the synchrotron light source according to the present disclosure.

As mentioned above, the magnets 220 connect the linear accelerators 210 to one another to transfer the electron beam.

The magnets 220 include a first magnet 221 for transferring the electron beam from the electron gun 100 to one side of the first linear accelerator 211, a second magnet 222 for transferring the electron beam emitted from the other side of the first linear accelerator 211 to the other side of the second linear accelerator 212, a third magnet 223 for transferring the electron beam emitted from one side of the second linear accelerator 212 to one side of the third linear accelerator 213, a fourth magnet 224 for transferring the electron beam emitted from the other side of the second linear accelerator 212 to the other side of the fourth linear accelerator 214, a fifth magnet 225 for transferring the electron beam emitted from one side of the fourth linear accelerator 214 to one side of the fifth linear accelerator 215, a sixth magnet 226 for transferring the electron beam emitted from the other side of the fifth linear accelerator 215 to the other side of the sixth linear accelerator 216, and a seventh magnet 227 for transferring the electron beam emitted from one side of the sixth linear accelerator 216 to the storage ring 300.

Figure 5:
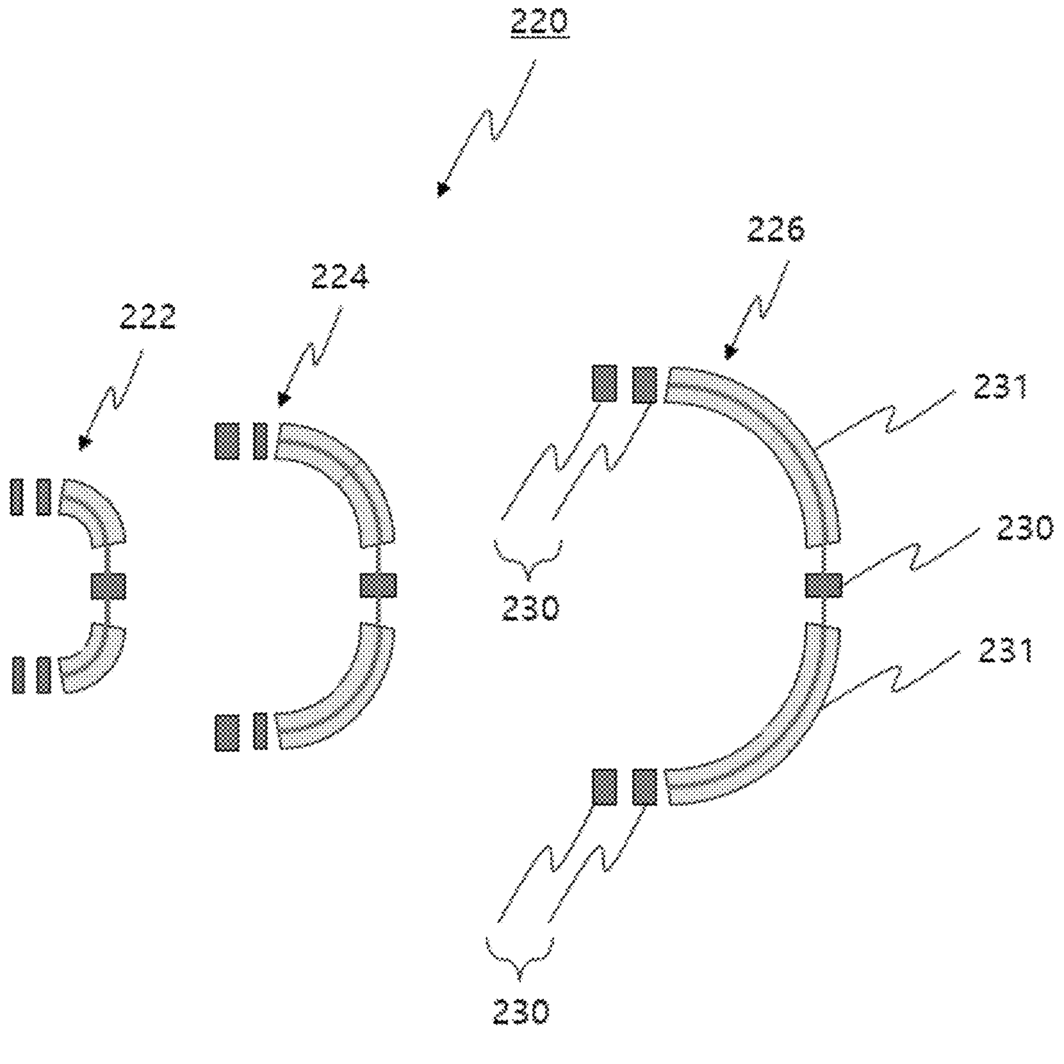
FIG. 5 is a detailed diagram showing the magnets of the synchrotron light source according to the present disclosure.

FIG. 5 is a detailed diagram showing the magnets of the synchrotron light source according to the present disclosure.

According to the present disclosure, one magnet 220 consists of the combination of quadrupole magnets 230 and dipole magnets 231. That is, each of the magnets 222, 224, and 226 consists of the combination of the quadrupole magnets 230 and the dipole magnets 231. In detail, one magnet 220 is formed of an achromatic bend combined with a quadrupole magnet, a quadrupole magnet, a dipole magnet, a quadrupole magnet, a dipole magnet, a quadrupole magnet, and a quadrupole magnet in order mentioned above.

According to the present disclosure, a magnetic field is formed only by permanent magnets, without any use of electromagnets or booster rings, according to purposes of use of the synchrotron light source, so that an amount of power consumed in the synchrotron light source can be minimized.

The two dipole magnets 231 of one magnet serve to bend the track of the electron beam to 90°, and one quadrupole magnet 230 located in the middle of the two dipole magnets 231 serves to correct horizontal dispersion η occurring due to angle differences made when electrons having different kinetic energy in the electron beam are bent by the dipole magnets 231.

$$\Delta x = \eta \Delta E$$

(wherein Δx represents beam spreading in a horizontal direction, ΔX represents beam energy spreading, and η represents dispersion (a correlation coefficient between beam energy and beam spreading))

The four quadrupole magnets 230 located on the outside serve to modify the beta function of transverse size of the electron beam. The beta function is a function related to the size of the beam.

Transverse beta function $\beta_x = \sigma^2_X / E$ (wherein $\sigma_x$ represents a transverse beam size and $E_x$ represents transverse beam emittance)

Figure 6:
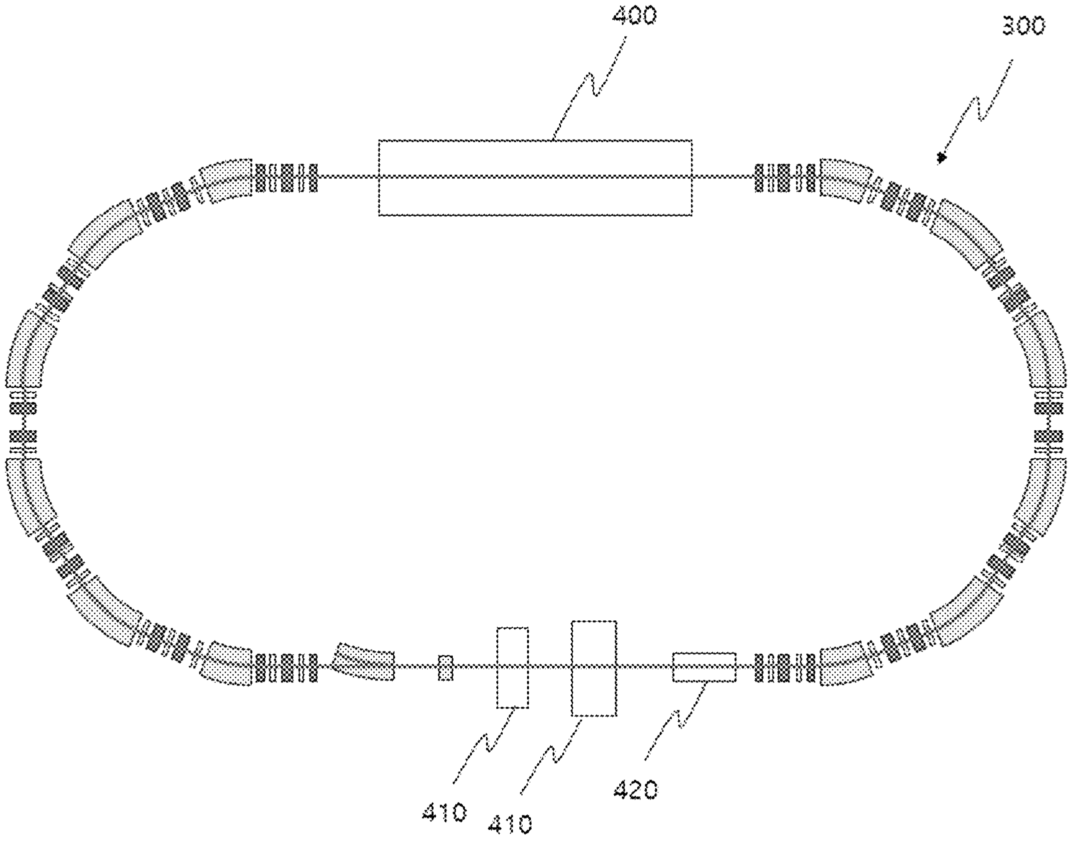
FIG. 6 is a diagram showing a storage ring of the synchrotron light source according to the present disclosure.

FIG. 6 is a diagram showing the storage ring of the synchrotron light source according to the present disclosure. According to the present disclosure, if the electron beam produced from the electron gun 100 is accelerated and finally emitted through the plurality of linear accelerators 210, the electron beam is incident onto the storage ring 300, and the storage ring 300 is located on the outermost position of the synchrotron light source of the present disclosure. The electron beam accelerated through the accelerator 200 passes through storage ring acceleration pipes 410 and a storage ring incidence kicker 420 and is then stored in the storage ring 300.

Figure 7:
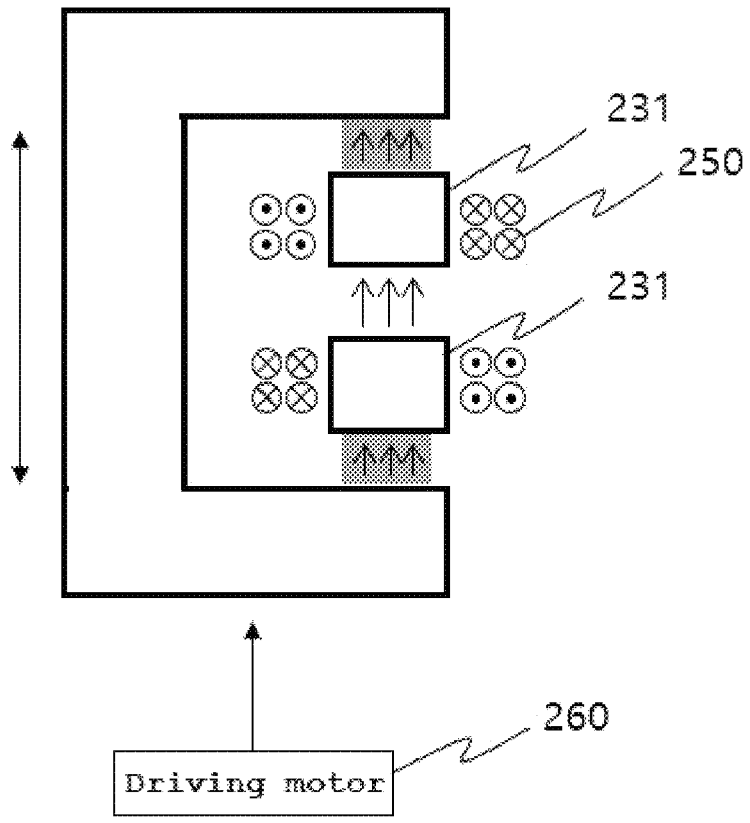
FIG. 7 is a diagram showing another example of the magnets of the synchrotron light source according to the present disclosure.

FIG. 7 is a diagram showing another example of the magnets of the synchrotron light source according to the present disclosure.

According to the present disclosure, the magnets 220 are formed of permanent magnets to control the direction of the electron beam accelerated, but to allow the track of the electro beam to be minutely controlled or to precisely control the bending of the electrons having different kinetic energy in the electron beam due to the dipole magnets in designing the synchrotron light source 10 of the present disclosure, the magnets further include control coils for finely controlling the magnetic field.

In this case, the dipole magnet 231 of the magnets 220 includes a control coil 250 for supplying an electric current to finely control the intensity of the magnetic field, and the control coil 250 controls the intensity of the magnetic field within the range of 5% of the intensity of the magnetic field.

According to the present disclosure, further, a driving motor 260 is provided separately from the dipole magnets and the quadrupole magnets, so that yokes of the permanent magnets are moved in position to finely control the intensity of the magnetic field.

As set forth in the foregoing, the synchrotron light source according to the present disclosure can produce stable high-power synchrotron radiation only through the plurality of linear accelerators.

Further, the synchrotron light source according to the present disclosure can produce the synchrotron radiation only through the permanent magnets controlling the track of the electron beam and the beam characteristics, while the plurality of linear accelerators are being applied thereto, without any use of booster rings to which electromagnets are applied, thereby reducing an amount of power consumed.

Furthermore, the synchrotron light source according to the present disclosure can minimize an installation space thereof, thereby solving the space limitation disadvantages in the existing accelerator-based synchrotron light source.

Although specific embodiments have been illustrated and described herein, it will be appreciated by those of ordinary skill in the art that any specific arrangement of software, which is calculated to achieve the same purpose, may be substituted for the specific embodiment shown. This application is intended to cover any adaptations or variations of the present disclosure. Therefore, it is manifestly intended that this disclosure be limited only by the claims and the equivalents thereof.

What is claimed is:

1. A synchrotron light source for producing synchrotron radiation through acceleration of an electron beam, comprising:

an electron gun for producing the electron beam;

a plurality of accelerators arranged parallel to one another to continuously accelerate the electron beam produced from the electron gun;

a storage ring for storing the electron beam accelerated through the plurality of accelerators; and an undulator for producing the synchrotron radiation from the electron beam stored in the storage ring, wherein the plurality of accelerators comprise a plurality of linear accelerators arranged parallel to one another in a longitudinal direction on the plane, and wherein the plurality of linear accelerators comprise:

a first linear accelerator for initially receiving the electron beam produced from the electron gun to accelerate the electron beam;

a second linear accelerator arranged to face the first linear accelerator and receive the electron beam from the first linear accelerator;

a third linear accelerator arranged parallel to the first linear accelerator at the outside of the first linear accelerator and receiving the electron beam from the second linear accelerator;

a fourth linear accelerator arranged parallel to the second linear accelerator at the outside of the second linear accelerator and receiving the electron beam from the third linear accelerator;

a fifth linear accelerator arranged parallel to the third linear accelerator at the outside of the third linear accelerator and receiving the electron beam from the fourth linear accelerator; and a sixth linear accelerator arranged parallel to the fourth linear accelerator at the outside of the fourth linear accelerator and receiving the electron beam from the fifth linear accelerator.

2. The synchrotron light source according to claim 1, wherein the plurality of accelerators are adapted to accelerate the electron beam in such a way as to allow the electron beam produced from the electron gun to pass therethrough only once.

3. The synchrotron light source according to claim 1, wherein the plurality of accelerators comprise a plurality of magnets for converting the direction of the electron beam from one of the plurality of linear accelerators to the next linear accelerator to transfer the electron beam converted in direction.

4. The synchrotron light source according to claim 3, wherein the plurality of linear accelerators and the plurality of magnets are connected to one another in the form of a one-way to allow the electron beam produced from the electron gun to be stored in the storage ring.

5. The synchrotron light source according to claim 3, wherein the plurality of magnets comprise a first magnet for transferring the electron beam from the electron gun to the first linear accelerator, second to sixth magnets for transferring the electron beam emitted from one of the plurality of linear accelerators to the next linear accelerator, and a seventh magnet for transferring the electron beam emitted from the sixth linear accelerator to the storage ring.

6. The synchrotron light source according to claim 5, wherein the plurality of magnets comprise:

the first magnet for transferring the electron beam from the electron gun to one side of the first linear accelerator;

the second magnet for transferring the electron beam emitted from the other side of the first linear accelerator to the other side of the second linear accelerator;

the third magnet for transferring the electron beam emitted from one side of the second linear accelerator to one side of the third linear accelerator;

the fourth magnet for transferring the electron beam emitted from the other side of the second linear accelerator to the other side of the fourth linear accelerator;

the fifth magnet for transferring the electron beam emitted from one side of the fourth linear accelerator to one side of the fifth linear accelerator;

the sixth magnet for transferring the electron beam emitted from the other side of the fifth linear accelerator to the other side of the sixth linear accelerator; and the seventh magnet for transferring the electron beam emitted from one side of the sixth linear accelerator to the storage ring.

7. The synchrotron light source according to claim 6, wherein each magnet consists of a combination of dipole magnets and quadrupole magnets to allow the electron beam passing through one of the plurality of linear accelerators to be transferred to the next linear accelerator.

8. The synchrotron light source according to claim 7, wherein the dipole magnets and quadrupole magnets are permanent magnets providing a magnetic field.

9. The synchrotron light source according to claim 1, wherein the plurality of accelerators are located inside the storage ring.

10. The synchrotron light source according to claim 5, wherein each magnet is formed of an achromatic bend combined with a quadrupole magnet, a quadrupole magnet, a dipole magnet, a quadrupole magnet, a dipole magnet, a quadrupole magnet, and a quadrupole magnet in order, to allow the electron beam passing through one of the plurality of linear accelerators to be transferred to the next linear accelerator.

11. The synchrotron light source according to claim 1, wherein the plurality of linear accelerators are laminatedly arranged parallel to one another on the plane.

12. The synchrotron light source according to claim 8, wherein each dipole magnet and each quadrupole magnet have a control coil for finely controlling the intensity of the magnetic field through the supply of an electric current.

13. The synchrotron light source according to claim 10, wherein each dipole magnet and each quadrupole magnet have a control coil for finely controlling the intensity of the magnetic field through the supply of an electric current.

14. The synchrotron light source according to claim 12, wherein the control coil controls the intensity of the magnetic field within the range of 5% of the intensity of the magnetic field.

15. The synchrotron light source according to claim 8, wherein each dipole magnet and each quadrupole magnet finely control the intensity of the magnetic field through the control of a driving motor.

16. The synchrotron light source according to claim 10, wherein each dipole magnet and each quadrupole magnet finely control the intensity of the magnetic field through the control of a driving motor.

17. The synchrotron light source according to claim 1, wherein the undulator produces extreme ultraviolet (EUV) light.

* * * * *